US009153363B2

(12) United States Patent
Tsutsumi et al.

(10) Patent No.: US 9,153,363 B2
(45) Date of Patent: *Oct. 6, 2015

(54) LIGHT-TRANSMITTING METAL ELECTRODE AND PROCESS FOR PRODUCTION THEREOF

(71) Applicant: Kabushiki Kaisha Toshiba, Tokyo (JP)

(72) Inventors: Eishi Tsutsumi, Kawasaki (JP); Tsutomu Nakanishi, Tokyo (JP); Akira Fujimoto, Kawasaki (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/173,868

(22) Filed: Feb. 6, 2014

(65) Prior Publication Data

US 2014/0151326 A1 Jun. 5, 2014

Related U.S. Application Data

(62) Division of application No. 12/236,132, filed on Sep. 23, 2008, now Pat. No. 8,686,459.

(30) Foreign Application Priority Data

Feb. 25, 2008 (JP) ................................ 2008-042894

(51) Int. Cl.
*H01L 33/38* (2010.01)
*H01B 13/00* (2006.01)
(Continued)

(52) U.S. Cl.
CPC .............. *H01B 13/0036* (2013.01); *H01J 1/02* (2013.01); *H01J 9/02* (2013.01); *H01J 17/04* (2013.01); *H01J 63/02* (2013.01); *H01J 2217/49207* (2013.01)

(58) Field of Classification Search
CPC ............ H01L 51/5203; H01L 51/5234; H01L 2251/5315; H01L 33/00; H01L 33/36; H01L 33/38; H01L 33/504; H01J 1/02; H01J 9/02; H01J 17/04; H01J 2217/49207; H01B 13/0036
USPC ............... 438/28, 29; 257/E21.492; 427/162; 216/17
See application file for complete search history.

(56) References Cited

U.S. PATENT DOCUMENTS

| | | | |
|---|---|---|---|
| 5,408,345 | A | 4/1995 | Mitsui et al. |
| 5,610,741 | A | 3/1997 | Kimura |

(Continued)

FOREIGN PATENT DOCUMENTS

| | | |
|---|---|---|
| JP | 11-72607 | 3/1999 |
| JP | 2005-230947 | 9/2005 |

(Continued)

OTHER PUBLICATIONS

Bethe, "Theory of Diffraction by Small Holes", The Physical Review, vol. 66, Nos. 7 and 8, pp. 163-182, (Oct. 1 and 15, 1994).

(Continued)

*Primary Examiner* — Latanya N Crawford
(74) *Attorney, Agent, or Firm* — Finnegan, Henderson, Farabow, Garrett & Dunner, L.L.P.

(57) ABSTRACT

The present invention provides a light-transmitting metal electrode including a substrate and a metal electrode layer having plural openings. The metal electrode layer also has such a continuous metal part that any pair of point-positions in the part is continuously connected without breaks. The openings in the metal electrode layer are periodically arranged to form plural microdomains. The plural microdomains are so placed that the in-plane arranging directions thereof are oriented independently of each other. The thickness of the metal electrode layer is in the range of 10 to 200 nm.

5 Claims, 6 Drawing Sheets

(51) Int. Cl.
*H01J 1/02* (2006.01)
*H01J 9/02* (2006.01)
*H01J 17/04* (2012.01)
*H01J 63/02* (2006.01)

(56) References Cited

U.S. PATENT DOCUMENTS

| | | | | |
|---|---|---|---|---|
| 6,040,936 | A | 3/2000 | Kim et al. | |
| 6,258,618 | B1 | 7/2001 | Lester | |
| 6,262,783 | B1 | 7/2001 | Tsuda et al. | |
| 6,565,763 | B1 | 5/2003 | Asakawa et al. | |
| 6,836,494 | B1 | 12/2004 | Stuart | |
| 7,033,936 | B1 * | 4/2006 | Green | 438/669 |
| 7,129,183 | B2 * | 10/2006 | Mori et al. | 438/745 |
| 7,419,908 | B2 * | 9/2008 | Green | 438/689 |
| 7,436,874 | B2 | 10/2008 | Onishi et al. | |
| 7,535,527 | B2 | 5/2009 | Yun | |
| 7,928,353 | B2 * | 4/2011 | Fujimoto et al. | 250/208.1 |
| 7,939,133 | B2 * | 5/2011 | Jia et al. | 427/256 |
| 8,134,223 | B2 | 3/2012 | Nakahata et al. | |
| 8,334,547 | B2 * | 12/2012 | Tsutsumi et al. | 257/99 |
| 2003/0160557 | A1 | 8/2003 | Chen et al. | |
| 2004/0188150 | A1 | 9/2004 | Richard et al. | |
| 2005/0110001 | A9 | 5/2005 | Chen et al. | |
| 2005/0202587 | A1 * | 9/2005 | Redecker et al. | 438/99 |
| 2006/0192483 | A1 * | 8/2006 | Nakanishi et al. | 313/504 |
| 2007/0018077 | A1 * | 1/2007 | Puscasu et al. | 250/210 |
| 2007/0034978 | A1 | 2/2007 | Pralle et al. | |
| 2007/0096087 | A1 | 5/2007 | Catrysse et al. | |
| 2007/0183035 | A1 | 8/2007 | Asakawa et al. | |
| 2007/0284601 | A1 * | 12/2007 | Khanarian | 257/98 |
| 2007/0290189 | A1 | 12/2007 | Lee et al. | |
| 2008/0260941 | A1 * | 10/2008 | Jin | 427/126.4 |
| 2008/0268288 | A1 * | 10/2008 | Jin | 428/800 |
| 2009/0032797 | A1 | 2/2009 | Hirohata et al. | |
| 2009/0079322 | A1 * | 3/2009 | Tsutsumi et al. | 313/349 |
| 2009/0114944 | A1 * | 5/2009 | Ono et al. | 257/103 |
| 2009/0211783 | A1 | 8/2009 | Tsutsumi et al. | |
| 2009/0213367 | A1 | 8/2009 | Green | |
| 2009/0219617 | A1 * | 9/2009 | Asakawa et al. | 359/486 |
| 2009/0236962 | A1 | 9/2009 | Fujimoto et al. | |
| 2009/0242925 | A1 | 10/2009 | Kitagawa et al. | |
| 2010/0001637 | A1 | 1/2010 | Satou | |
| 2011/0049556 | A1 | 3/2011 | Fujimoto et al. | |

FOREIGN PATENT DOCUMENTS

| | | |
|---|---|---|
| JP | 2005-279807 | 10/2005 |
| WO | WO 2005121843 A1 | 12/2005 |

OTHER PUBLICATIONS

Ghaemi et al., "Surface plasmons enhance optical transmission through subwavelength holes", Physical Review B, vol. 58, No. 11, pp. 6779-6782, (Sep. 15, 1998).

Genet et al., "Light in tiny holes", Nature, vol. 445, pp. 39-46, (Jan. 4, 2007).

Tsutsumi et al., U.S. Appl. No. 12/187,653, filed Aug. 7, 2008.

Notification of Reason for Rejection issued by the Japanese Patent Office on Dec. 7, 2012, for Japanese Patent Application No. 2008-042894, and English-language translation thereof.

Notification of Reason for Rejection issued by the Japanese Patent Office on Feb. 15, 2013, for Japanese Patent Application No. 2008-042894, and English-language translation thereof.

* cited by examiner

LIGHT-TRANSMITTING METAL ELECTRODE AND PROCESS FOR PRODUCTION THEREOF

CROSS-REFERENCE TO RELATED APPLICATIONS

This is a division of application Ser. No. 12/236,132, filed Sep. 23, 2008, which is incorporated herein by reference.

This application is based upon and claims the benefit of priority from the prior Japanese Patent Applications No. 42894/2008, filed on Feb. 25, 2008; the entire contents of which are incorporated herein by reference.

BACKGROUND OF THE INVENTION

1. Field of the Invention

The present invention relates to a light-transmitting metal electrode. In detail, the invention relates to a light-transmitting metal electrode having a hyperfine structure. The present invention also relates to a process for production of the light-transmitting metal electrode.

2. Background Art

Light-transmitting metal electrodes, which have light transparency particularly in the visible region and at the same time which function as electrodes, are widely used in electronics industries. For example, all the displays distributed currently in markets, except displays of cathode ray tube (CRT) type, need light-transmitting metal electrodes since they adopt electric driving systems. According as flat panel displays typically such as liquid crystal displays and plasma displays have been explosively getting popular in recent years, the demand for transparent metal electrodes has been rapidly increasing.

In early studies of electrodes that transmit light, the electrodes were mainly made of a metal such as Au, Ag, Pt, Cu, Rh, Pd or Cr in the form of such very thin foil having a thickness of 3 to 15 nm that the metal foil could have light transparency to a certain degree. When used, for example, the thin metal foil was inserted between transparent dielectric layers for improving durability. However, since the foil was made of a metal, there was a trade-off relationship between resistivity and light-transmittance and hence it could not have properties satisfying enough to put various devices into practical use. The mainstream study, therefore, shifted to oxide semiconductors. In present, almost all the practical light-transmitting metal electrodes are made of oxide semiconductor materials. For example, indium tin oxide (hereinafter, referred to as "ITO"), which is indium oxide containing tin as a dopant, is generally used.

However, as described below in detail, the trade-off relationship between resistivity and light-transmittance is essentially still present even in oxide semiconductor materials. The problem in metal foil is that the light-transmittance decreases in accordance with increase of the foil thickness, while the problem in oxide semiconductor materials is that the light-transmittance decreases in accordance with increase of the carrier density. Accordingly, the problem to study is only changed from the former to the latter.

As described above, the demand for light-transmitting metal electrodes is expected to keep expanding in the future in many applications, but there are some future problems.

First, there is a fear that indium, which is employed as a material for the electrodes, will be exhausted. Indium is a major component of ITO, which is widely used in the light-transmitting metal electrodes, and is hence expected to be exhausted in the worldwide range according as the demand for displays typically such as thin displays increases rapidly. It is a real fact that there is a shortage of rare metals such as indium, and accordingly the cost of materials has really risen remarkably. Thus, this is a serious problem.

To cope with this problem, for example, in the sputtering process for forming an ITO film, it is studied to reuse even an ITO membrane deposited on the inner wall of vacuum chamber so as to improve the efficiency of ITO target to the utmost limit. However, techniques like that only postpone the exhaustion of indium and they by no means essentially solve the problem. In consideration of that, indium-free transparent electrodes are currently being developed. However, at present, any substitute such as zinc oxide material or tin oxide material is not yet capable of exhibiting properties exceeding ITO.

The second problem is that, if the carrier density is increased to improve electric conductively of oxide semiconductor material, the reflection in a longer wavelength region is increased to lower the transmittance. The reason for this is as follows.

According to electronic states, substances are generally classified into two types: some substances have energy gaps, and the others do not. Even when the substances having energy gaps are irradiated with light having energy smaller than the gaps, they do not absorb the light because electrons do not undergo the band transition. Therefore, with respect to visible light in the wavelength region of 380 nm to 780 nm, the substances having energy gaps of more than approx. 3.3 eV are transparent to the light.

On the other hand, depending on the width of the energy gap between the valence band and the conduction band, substances are generally categorized into three types, namely, conductors, semiconductors and insulators. The substances having relatively small band gaps are conductors, and in contrast those having relatively large band gaps are insulators, and those having middle band gaps are semiconductors. Oxide semiconductors, which are assigned to semiconductors, have chemical bonds of strong ionic character and hence generally have large energy gaps. Accordingly, they can readily satisfy the above condition at a shorter wavelength in the visible region, but the transparency at a longer wavelength is liable to lower. Further, in the case where the oxide semiconductors are used in light-transmitting electrodes, carriers of electron drift, namely, carriers of electric current are doped to obtain conductivity and transparency to visible light. For example, ITO consists of $In_2O_3$ containing $SnO_2$ as a dopant. In this way, oxide semiconductors can be made to have low resistivities by increasing the carrier densities. However, according as the carrier density is increased, the electrode layer of oxide semiconductor as a whole becomes exhibiting metallic behavior and consequently the transmittance becomes decreasing from at a longer wavelength. Because of this phenomenon, there is a lower limit to the resistivity of light-transmitting electrodes made of oxide semiconductor.

In order to ensure transparency in the visible region, the oxide semiconductor must have a plasma frequency corresponding to a wavelength in the infrared region. This means that there is an upper limit to the carrier density. Consequently, ITO produced generally has a carrier density of n=approx. $0.1\times10^{22}$ [$cm^{-3}$], which is a few percent of the carrier densities of metals. The lower limit of the resistivity calculated from that value is approx. 100 μΩ·cm, and it is difficult in principle to further reduce the resistivity.

Meanwhile, it is proposed (in JP-A 1999-72607 (KOKAI)) that regularly arranged openings having a radius smaller than the wavelength of incident light be provided on the surface of highly electrically conductive thin metal foil, whereby the metal foil is made transparent to light.

Because of the aforementioned circumstances, it is desired to provide a light-transmitting metal electrode made of an electrically conductive material which is versatile and inexpensive, which is free from the fear of exhaustion and also which can keep a low resistivity, namely, a high electric conductivity.

SUMMARY OF THE INVENTION

A light-transmitting metal electrode according to the present invention is characterized by comprising a substrate and a metal electrode layer having a thickness of 10 to 200 nm formed on the substrate, wherein said metal electrode layer comprises:

a metal part so continuous that any pair of point-positions in said part is continuously connected without breaks, and plural openings which penetrate through said layer and which are arranged so periodically that the distribution of the openings is represented by a radial distribution function curve having a half-width of 5 to 300 nm.

A second light-transmitting metal electrode according to the present invention is characterized by comprising a substrate and a metal electrode layer having a thickness of 10 to 200 nm formed on the substrate, wherein said metal electrode layer includes of plural microdomains neighboring each other on the substrate, each microdomain comprises a metal part so continuous that any pair of point-positions in said part is continuously connected without breaks, and plural openings which penetrate through said layer and which are arranged periodically, and further said microdomains are so placed that the arranging direction of the openings in each microdomain is oriented at random.

Further, a first process according to the present invention is a process for production of the above light-transmitting metal electrode, wherein an etching process is carried out by using a monoparticle layer of fine particles arranged in the form of a dot pattern of microdomains as a mask, to produce a metal electrode layer having openings.

A second process according to the present invention is a process for production of the above light-transmitting metal electrode, comprising the steps of:

preparing a substrate, forming an organic polymer layer on said substrate, forming a monoparticle layer of fine particles in the form of a dot pattern of microdomains on said organic polymer layer, processing said fine particles by etching until the particles have a desired size, transferring the monoparticle layer of the etching-processed fine particles onto the organic polymer layer, so that columnar structures made of the organic polymer and the etching-processed fine particles are formed on the surface of the substrate, forming a metal layer among the formed columnar structures, and removing the organic polymer.

A third process according to the present invention is a process for production of the above light-transmitting metal electrode, comprising the steps of:

preparing a substrate, performing an etching process by using a monoparticle layer of fine particles arranged in the form of a dot pattern of microdomains as a mask, to form a structure having the dot pattern on the substrate, using the dot-patterned structure formed on the substrate as a mold, to produce a stamper having said structure on a second substrate, putting said stamper onto a third substrate so as to transfer the pattern, so that a structure having the transferred pattern is formed; and then using the structure formed by transferring as a mask to produce a metal electrode layer having openings.

Still another light-transmitting metal electrode according to the present invention is characterized by comprising a substrate and a metal electrode layer having a thickness of 10 to 200 nm formed on the substrate, wherein said metal electrode layer includes of plural microdomains which neighbor each other on the substrate and which have an average projected area in the range of 1 to 400 $\mu m^2$, each microdomain comprises a metal part so continuous that any pair of point-positions in said part is continuously connected without breaks, and plural openings which penetrate through said layer and which are so arranged periodically that the period of arrangement is in the range of 100 to 1000 nm, said microdomains are so placed that the arranging direction of the openings in each microdomain is oriented at random, and the light-transmittance at the wavelength of light incident to said light-transmitting metal electrode is not smaller than the mean area ratio of the openings in the metal layer.

The present invention provides a light-transmitting metal electrode having high transparency while keeping a low resistivity by using a metal as the electrically conductive material of the electrode. Since the high transparency of the electrode is given by the particular hyperfine structure, the metal used as the material can be selected widely from almost all metals independently of chemical properties thereof. This means that it is unnecessary to use conventional rare metal oxide materials, and accordingly a versatile and inexpensive light-transmitting metal electrode can be provided. Further, it is also possible to make a breakthrough into the lower limit to resistivities of light-transmitting electrodes made of conventional oxide semiconductors and accordingly to provide an electrode having lower resistivity.

DETAILED DESCRIPTION OF THE INVENTION

As described above, from the theoretical viewpoint, there is a lower limit to the resistivity of light-transmitting electrode made of conventional oxide semiconductor such as ITO. On the other hand, however, according as electronics technologies, in particular, mobile devices such as cellular phones and notebook-size PCs become further developed, it obviously becomes more required to reduce the resistivity of light-transmitting electrode since the resistivity increases the electric power consumption. It is difficult to solve this contradictory problem only by the conventional technology.

In view of the above, the present invention is achieved.

The light-transmitting metal electrode and the process for production thereof according to the present invention are explained below in detail with the attached drawings referred to.

Figure 1A:
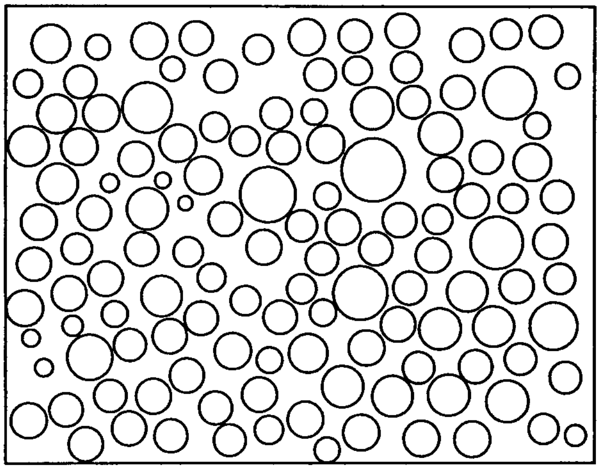
FIGS. 1A and 1B illustrate an example of the pattern of the light-transmitting metal electrode having openings.
Figure 1B:
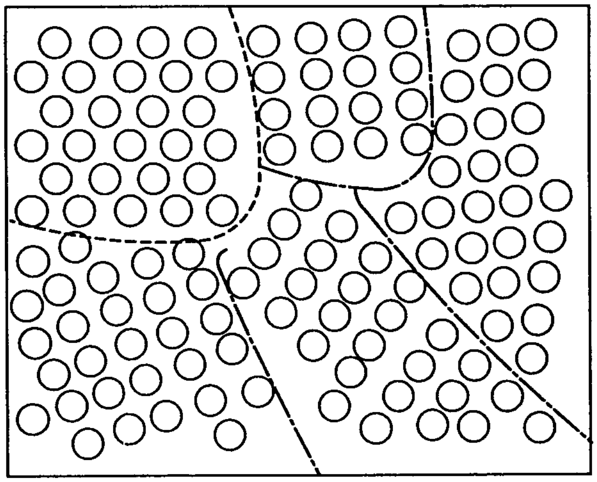

FIG. 1 shows an embodiment of the light-transmitting metal electrode according to the present invention. FIG. 1 is a plan view of the light-transmitting metal electrode. The light-transmitting electrode comprises a smooth substrate and a metal electrode layer provided thereon. The metal electrode layer comprises a metal part and fine openings penetrating through the metal part. The metal electrode layer can function as an electrode and at the same time can transmit light in the visible wavelength region.

The light-transmitting metal electrode according to the present invention is characterized in that the transparency is more than expected from the total area occupied by the openings in the metal electrode layer.

The above metal electrode layer has openings, namely holes having a radius much smaller than the wavelength of light incident onto the electrode, and thereby can serve as a light-transmitting electrode although made of a metal. The reason for this is simply explained as follows. The holes smaller than the wavelength of light are periodically provided on the layer of thin metal foil. When the metal foil is exposed to light, the surface plasmons and the incident light are coupled by the periodically arranged holes to enhance the transmittance of light at a particular wavelength.

If there is distribution in the periodical arrangement of the openings, the transmitted light less depends upon the wavelength. Further, if the periodically arranged holes form plural microdomains which are so placed that the in-plane arranging directions thereof are oriented independently of each other, light polarized in all the directions can be transmitted isotropically.

Here, the term "wavelength of light" means a wavelength of light incident onto the light-transmitting electrode when the electrode is used. Accordingly, the wavelength can be selected in a wide range, but is in the visible wavelength region of 380 nm to 780 nm.

In the case where a transparent substrate is used, the substrate preferably has a transmittance of 80% or more. The transmittance is more preferably 90% or more so as to ensure a satisfying transmittance of the electrode.

This technology has about two great advantages. One is that it is unnecessary to use rare metal oxide materials, such as ITO, which conventional light-transmitting metal electrodes are made of. The other is that, since electric conduction is given by free electrons in the metal layer, the light-transmitting metal electrode can be expected to have an electric conductivity higher than known electrodes made of carrier-doped metal oxide semiconductive materials.

The basic theory of the present invention is then explained below.

First, with respect to the phenomenon that light passes through the thin metal foil provided with holes having a radius smaller than the wavelength of light, the theoretical explanation is given below. The above phenomenon has been hitherto explained on the basis of Bethe's theory of diffraction (cf., H. A. Bethe, Theory of Diffraction by Small Holes, Physical Review 66, 163-82, 1944). On the assumptions that the metal foil is a perfect conductor and that the thickness of the foil is infinitesimal, the total intensity (A) of all polarized light transmitted through the openings having a radius (a) smaller than the wavelength (λ) is expressed by the following formula (1):

$$A=[64k^4a^6(1-3/8\sin^2\theta)]27\pi \quad (1)$$

wherein k is a wave number of the light ($k=2\pi/\lambda$), and θ is an incident angle.

The efficiency (η) of the transmitted light per the light incident onto the openings can be obtained if the intensity (A) is divided by the area of openings ($\pi a^2$). That is:

$$\eta=64(ka)^4/27\pi \quad (2).$$

The wave number (k) is in inverse proportion to the wavelength (λ), and consequently the above formula means that the light-transmitting efficiency (η) is in proportion to $(a/\lambda)^4$. Accordingly, it has been thought that the transmittance of light decreases drastically according as the radius (a) of the openings decreases.

The above theory is often applied to theoretical analyses of, for example, mesh-shielding in the microwave region, and well-agrees with phenomena in practice. For example, if a microwave oven generating electromagnetic waves having a wavelength of 12 cm is surrounded by a metal mesh having 1 mm radius, the electromagnetic wave hardly leaks out.

However, the present inventors have studied about the fine structures of thin metal foil, and finally found that a light-transmittance higher than calculated from the above theory can be obtained if the thin metal foil comprises innumerable holes having a radius smaller than the wavelength of light.

It is reported that, when the metal foil is exposed to light, the above abnormal light-transmitting phenomenon is caused by resonant interaction between the surface plasmons and the incident light (cf., H. F. Ghaemi et al., "Surface Plasmons Enhance Optical Transmission Through Subwavelength Holes", Physical Review B, Vol. 58, No. 11, pp. 6779-6782 (Sep. 15, 1998)).

According to that report, the above phenomenon is explained as follow.

From the momentum conservation law, the wave number vector of surface plasmon in the metal foil having holes arranged in a periodic structure of tetragonal lattice on the surface is expressed by the following formula (3):

$$\bar{k}_{sp}=\bar{k}_x+i\bar{G}_x+j\bar{G}_y \quad (3)$$

wherein $$\bar{k}_{sp} \quad (4)$$

is the wave number vector of surface plasmon, $$\bar{k}_x = x(2\pi/\lambda)\sin\theta \quad (5)$$

is a component of the wave number vector of incident light in the plane of the foil, $\bar{G}_x$ and $\bar{G}_y$ are reciprocal lattice vectors satisfying the condition of:

$$\bar{G}_x = \bar{G}_y = (2\pi/P) \quad (6),$$

P is a period of the arrangement of holes, θ is an angle between the incident wave vector and the normal of the foil surface, and i and j are integers.

On the other hand, the absolute value of the wave number vector of surface plasmon can be obtained from the dispersion relation of surface plasmon:

$$|\bar{k}_{sp}| = \frac{\omega}{c}\sqrt{\frac{\varepsilon_m \varepsilon_d}{\varepsilon_m + \varepsilon_d}} \quad (7)$$

wherein

ω is an angular frequency of the incident light; $\in_m$ and $\in_d$ are relative dielectric constants of the metal and the dielectric medium, respectively; and $\in_d=1$ if the metal foil is irradiated in air. The above formula is derived on the assumptions of $\in_m<0$ and $|\in_d|\times\in_m$, which correspond to a metal or doped-semiconductor of less than the bulk surface energy.

In the case where the incident light comes perpendicularly (θ=0), the component parallel to the plane of the metal foil is 0 in the wave number vector of incident light. Accordingly, the above formulas for holes arranged in a tetragonal lattice are combined to obtain the following formula:

$$\lambda_{max} = \frac{P}{\sqrt{i^2 + j^2}}\sqrt{\frac{\varepsilon_d \varepsilon_d}{\varepsilon_m + \varepsilon_d}}. \quad (8)$$

Also in the case where the holes are arranged in a hexagonally symmetrical triangular lattice, the wavelength giving the maximum transmittance is expressed by the following formula:

$$\lambda_{max} = \frac{P}{\sqrt{\frac{4}{3}(i^2 + ij + j^2)}}\sqrt{\frac{\varepsilon_d \varepsilon_d}{\varepsilon_m + \varepsilon_d}}. \quad (9)$$

As shown in the above formulas, the wavelength giving the maximum transmittance is a function of the period (P) of the arrangement of holes, as well as, the dielectric constants of the metal, the substrate and air through which the metal foil is exposed to the light. When the condition of the above formula is satisfied, the incident light and the surface plasmon of the metal foil are combined, so that the light is transmitted at the diffraction limit. As a result, the periodically arranged openings transmit light at a particular wavelength determined by the period of the arrangement.

On the basis of the theory described above, light is presumed to pass through the metal foil comprising openings having a radius smaller than the wavelength of the incident light.

According to the above theory, for example, holes having a radius smaller than the wavelength of light to transmit are formed in a tetragonal lattice arrangement on the whole surface of the metal foil, and thereby the whole surface of the metal foil can transmit the light.

The above theory indicates that openings arranged in a single period enable the metal foil to transmit light in only a particular wavelength region, namely, monochromatic light, and hence the transmission spectrum of the metal foil has a very sharp maximum. This means that the metal foil has a very low transmittance to light in other colors. Further, if the foil is relatively thick, the transmittance is further lowered. Accordingly, the metal foil having those openings is unsuitable for an electrode transparent in a wide wavelength region although it is suitably applied to, for example, an optical filter.

The present inventors have studied about the metal foil having fine openings, and finally found that, if the openings have randomness in their shapes, sizes or periods of the arrangement, the transmitted light is not monochromatic. As a result, the present inventors have succeeded in producing a light-transmitting metal electrode having a relatively broad transmission band in the visible region. The above "randomness" means that the openings on the metal foil are arranged not in a single period but in distributed periods.

The arrangement in distributed periods has lower periodicity, namely, lower regularity than that in a single period, but it has the following advantage. When a substance is exposed to light having a frequency lower than the plasma frequency, free electrons in the substance are polarized by the electric field of the light. The polarization is induced in such direction that the electric field of light may be cancelled. The electric field of light is thus shielded by the induced polarization of electrons, so that the light does not penetrate into the substance and thus, what is called, "plasma reflection" is observed. If the substance in which the free electrons are induced to be polarized has areas, for example, holes arranged at random, where the electrons cannot move, it is thought that the movement of the electrons is restricted by the geometrical structure and, as a result, that the electric field of light cannot be shielded. Consequently, it is expected to improve the transparency to the light.

As described above, how the arrangement periods of the openings are distributed is suitably defined by a radial distribution function curve. The "radial distribution function curve" is a statistical distribution function curve showing an existence probability of matter at a distance (r) from a particular object (A) (cf., Iwanami Rikagaku Jiten (Iwanami's Dictionary of Physics and Chemistry, written in Japanese) $4^{th}$ edition).

In the present invention, the radial distribution function curve indicates an existence probability of the centers of openings at a distance (R) from the center of an optionally determined opening. The "center of opening" is clear in the case where the opening is a circle, but is regarded as the center of gravity in the case where the opening has a shape other than a circle. The "center of gravity" here geometrically means a point around which primary moments in the shape are 0 in total. It can be also expressed by the formula:

$$\int_D (g-x)dx = 0 \quad (10)$$

wherein

D stands for the shape, and g stands for the center of gravity.

The center of gravity is practically determined in the following manner. On an image of the opening, circular lines at equal intervals are drawn from the edge. In concrete, on an image obtained by electron microscopy or interatomic-force microscopy, circular lines at equal intervals are drawn from the edge. The center of the thus-obtained circular lines corresponds to the center of gravity, and hence the circular lines are image-processed to obtain the center of gravity. In this way, the radial distribution function curve of openings having any shapes can be obtained.

Figures 2A, 2B, 2C:
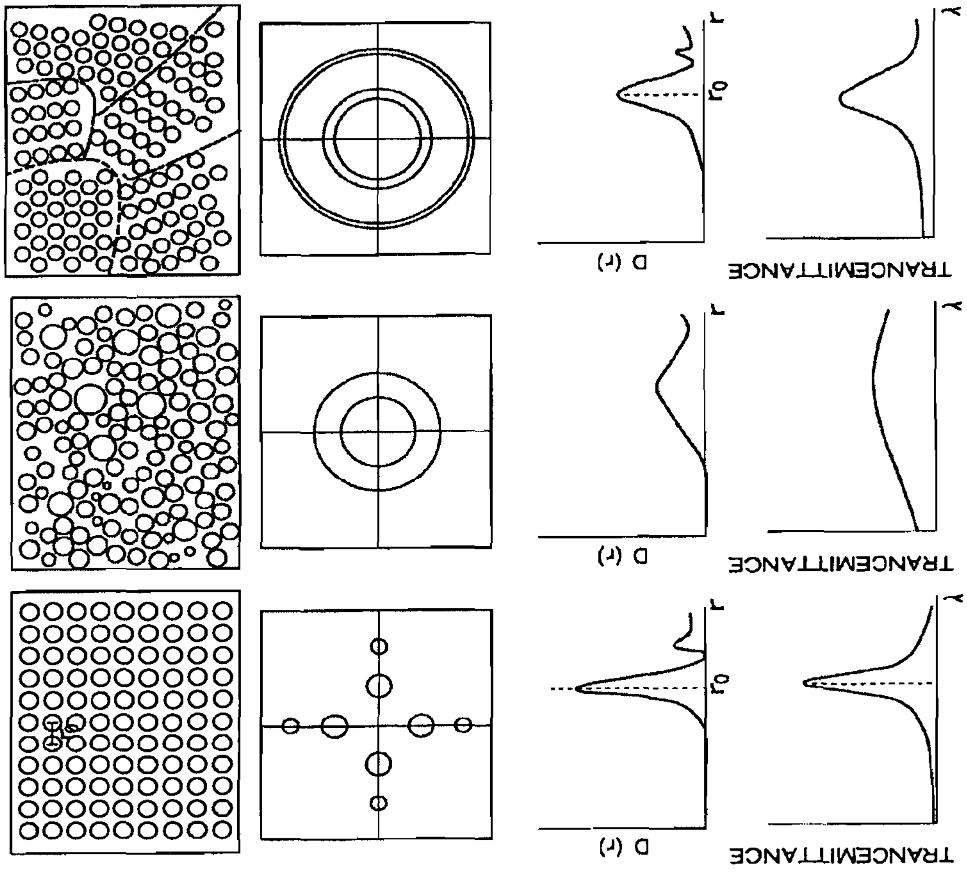
FIG. 2 illustrates schematic patterns of the light-transmitting metal electrodes having openings, their spectra of two-dimensional reciprocal lattice, curves of their radial distribution functions, and wavelength dependences of light transmitted through them.

The image of the metal foil having the openings is subjected to Fourier transform so as to obtain a two-dimensional reciprocal space exhibiting spots, whereby the radial distribution function curve can be understood clearly. FIG. 2 schematically illustrates various arrangements of openings in the metal foil, their spectra of two-dimensional reciprocal lattice, their radial distribution function curves, and wavelength dependences of light transmitted through them. FIG. 2(*a*) shows openings arranged periodically in the whole metal foil. In contrast, FIG. 2(*b*) shows openings arranged completely at random in the whole metal foil. FIG. 2(*c*) shows the case where the metal foil is composed of plural microdomains neighboring each other. The microdomains shown in FIG. 2(*c*) are arranged at random, but openings in each microdomain are periodically arranged.

Here, the two-dimensional reciprocal space is explained below in brief. If the foil has a sort of repeating structure (periodically arranged openings in this case), spots corresponding to the period of repeating are observed. A very regularly repeating structure, for example, a tetragonal lattice having the same plane-directions shown in FIG. 2(*a*) gives clear spots arranged in tetragonal symmetry. On the other hand, in the case where the period of repeating is constant in each domain but the domains have different in-plane directions independent of each other (shown in FIG. 2(*c*)), clear spots in the form of a ring are observed. Further, in the case where the openings are arranged at random and the arrangements of the openings have distributed periods, the two-dimensional reciprocal space gives spots in a defused broad ring (shown in FIG. 2(*b*)).

The radial distribution function curve is obtained from the circular integral at a distance (r) in the two-dimensional reciprocal space. Accordingly, in the case where the period is constant, a very sharp peak is observed at that period (at $r_0$ in Figure (a)). On the other hand, if the periods are distributed, a gentle curve of the radial distribution function is obtained (shown in FIG. 2(*b*)). The deviation of the periods is, therefore, represented by the half-width of the peak in the radial distribution function curve.

In the present invention, the "half-width of radial distribution function curve" means a half-width of the primary peak in the radial distribution function curve obtained in the manner described above. In other words, it means a half-width of the peak indicating the distance between the centers of gravity of the nearest openings. Generally, a half-width of a peak in the curve of the function f(x) means a difference ($X_b$–$X_a$) between the points $X_a$ and $X_b$ on the curve at a half (½)ΔF of the peak height ΔF. If the aforementioned periodical structure is completely a two-dimensional single crystalline structure, the half-width is a very small value. The more the periodicity has randomness, the larger the half-width becomes.

As a result of the study adopting the above analytical techniques, it is found that, if the half-width of radial distribution function curve is in the range of 5 nm to 300 nm, light transmitted through the metal foil less depends upon the wavelength and hence the transmission spectrum has a broad transmission band in the visible region.

The term "light-transmitting metal electrode" in the present invention means the electrode is made of normal metal that reflects light by natural, and therefore it also means the electrode has a relatively high transmittance as compared with metals that essentially do not transmit light. In the present invention, the light-transmitting metal electrode has a light-transmittance of 10% or more, preferably 30% or more, further preferably 50% or more.

Apart from the above, it is further found that a light-transmitting metal electrode having high transparency can be also obtained from the structure described below. The present inventors have found that, if the domains in which holes are regularly arranged have an average projected area of 1 $\mu m^2$ or more, the metal foil sufficiently transmits light. Since the resolution of human eyes is almost 20 μM, the average projected area of the domains is preferably not more than 400 $\mu m^2$.

According to the theory described above, for example, holes having a radius smaller than the wavelength of light are provided in a tetragonal lattice arrangement on the whole surface of the metal foil, so that the whole surface of the metal foil can transmit the light. However, if the two-dimensional single crystalline structure having the same plane-directions, that is to say, the structure in which holes are arranged with complete regularity is formed on the whole surface of the metal foil, light polarized in various directions such as natural light is transmitted anisotropically in accordance with the regularity of arrangement, so that the transmitted light is anisotropically polarized.

However, if plural domains satisfying the conditions described above are formed and so placed that the arranging directions thereof are oriented independently of each other, light is isotropically transmitted to avoid the above problem.

The fine structure according to the present invention has the following advantages in application to an electrode.

When the metal foil having the two-dimensional single crystalline structure formed on the whole surface is used as an electrode, the electric conductivity is liable to have in-plane anisotropy. In contrast, if the foil has the structure according to the present invention, the anisotropy can be reduced since the domains are macroscopically arranged completely at random.

Further, there are borders, so to speak, grain boundaries among the plural domains in the above structure. In areas near the grain boundaries, holes are often lost and hence the metal part is liable to occupy a relatively large space. Accordingly, in view of electric conductivity, the structure having plural domains and many grain boundaries among them has many paths through which electrons can move, and consequently the resistivity is expected to be lowered.

The shapes of the openings are not particularly restricted. Examples of the opening shapes include cylindrical shape, conical shape, triangular pyramidal shape, quadrilateral pyramidal shape, and other columnar or pyramidal shapes. Two or more shapes may be mixed. Even if the light-transmitting metal electrode according to the present invention contains various sizes of openings, the effect of the invention can be also obtained. In the case where the openings have various sizes, the diameters of the openings can be represented by the average.

The openings according to the present invention may be hollow, or otherwise may be filled with substances such as dielectrics. The substances stuffed in the openings are preferably transparent to the incident light.

The following description is based on the result that a metal electrode having fine openings was produced and measured in practice.

Figure 3:
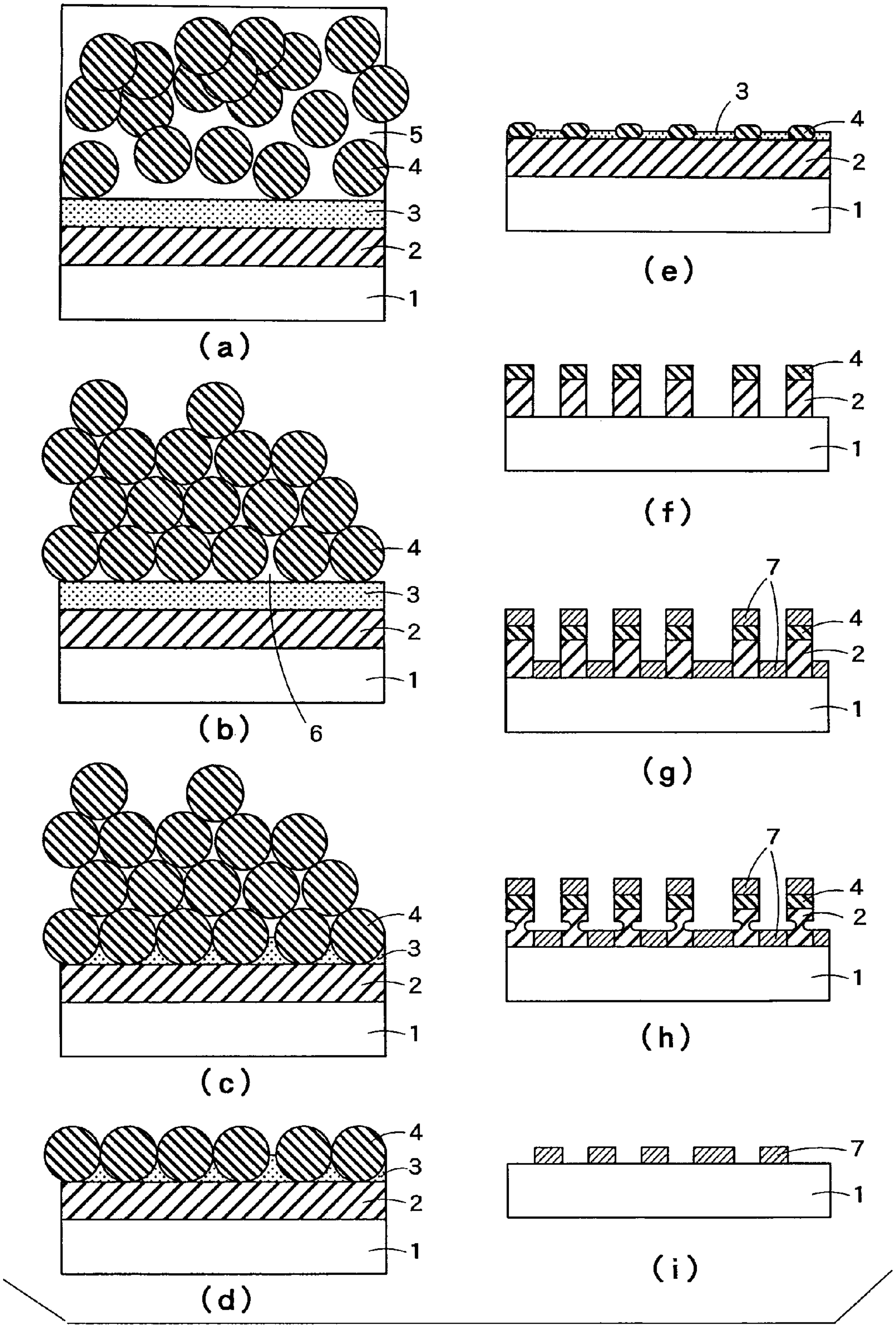
FIG. 3 schematically illustrates an example of the process for production of the light-transmitting metal electrode having openings according to one embodiment of the present invention.

FIG. 3 is an electron micrograph showing a top surface of the light-transmitting metal electrode comprising openings according to one practical embodiment.

In this embodiment, silica particles arranged in a monoparticle layer are used to produce a metal electrode. However, if the photo- or electron beam-lithographic processes are improved to produce the similar structure in the future, it can have the same function as the light-transmitting metal electrode according to the present invention. Further, the electrode can be also produced by an EB (electron beam) lithographic system or by an in-printing process in which a polymer film having fine convexes and concaves is used as a stamp to transfer a relief image composed of the convexes and concaves.

Furthermore, porous alumina obtained by anode oxidization of aluminum is also employable. The sizes and shapes of porosities are controlled by adjusting the acid solution and the applied voltage, to produce a mesh structure. The mesh structure can be used as a template in the etching or in-printing process, to produce the fine structure.

A monoparticle layer of silica fine particles is suitable for the template in the invention because the particles can self-assemble to form plural microdomains, so that the fine structure is readily produced without any expensive apparatus.

The fine structure, which is in nano-order, can be produced by the photo-lithographic process, which is used for microfabrication of semiconductors. However, in that process, an expensive apparatus is necessary and hence it costs a lot to produce the structure. On the other hand, although a pattern-formation method such as a laser interference method does not need an expensive apparatus, it is difficult to form a pattern in which plural microdomains parallel to the substrate are so placed that the arranging directions thereof are oriented independently of each other. The present inventors' study has revealed that the above pattern can be readily obtained by an etching process in which the monoparticle layer of self-assembling particles is used as a mask.

Known techniques (for example, disclosed in JP-A-2005-279807 (KOKAI)) are employable in the above process. As a method for forming the monoparticle layer on the substrate, it is known to utilize capillary force which functions on fine particles while a dispersion solution of the particles is being dried. In the monoparticle layer formed by self-assemblage of fine particles, the particles are often arranged periodically by the isotropical intermolecular force. On the other hand, however, it is difficult for the self-assemblage to place the particles in the arrangement having completely equal periodic axes on the whole surface of the substrate of a few centimeters square. In many cases, defects are formed and, as a result, plural domains in which the fine particles are periodically arranged are formed, but the plural domains are so placed that the in-plane arranging directions thereof are oriented independently of each other.

As described later in Examples, the monoparticle layer formed by self-assemblage of fine particles was used as an etching mask to form fine convexes and concaves on the substrate, and thereby a light-transmitting metal foil layer having desired openings was produced. If the particles used as the etching mask have submicron or smaller sizes, a pattern of submicron or smaller can be obtained to reduce the production cost.

The present inventors have found the conditions for forming a fine silica-monoparticle layer in which plural microdomains having periods of 100 to 1000 nm are formed and so placed that the arranging directions thereof are oriented independently of each other. The periods are preferably in the range of 200 to 500 nm. The monoparticle layer has a pattern of aligned dots, and the pattern is then transferred to a substrate in the manner described later. Thereafter, a metal is vaporized and deposited onto the substrate having the transferred pattern to form a metal electrode, and then the metal deposited in the area of the transferred pattern is removed to produce a light-transmitting metal electrode.

For producing the light-transmitting metal electrode according to the present invention, the silica-monoparticle layer in which the plural microdomains are arranged independently of each other is preferably used as an etching mask. An example of such production process is explained below with FIG. 3 referred to.

First, a transparent substrate 1 is prepared. If necessary, an organic polymer layer (resist layer) 2 is coated thereon in a thickness of 50 to 150 nm. The organic polymer layer 2 is preferably provided so as to improve the aspect ratio of mask pattern in etching the substrate.

If necessary, another organic polymer layer 3 is further coated in a thickness of 20 to 50 nm on the organic polymer layer 2. The organic polymer layer 3 functions as a trap layer that captures a monoparticle layer from a multilayer formed by coating a dispersion solution of silica fine particles, as described below.

On the organic polymer layer 3, a dispersion solution 5 in which fine silica particles 4 having a particular grain distribution are dispersed is spin-coated (FIG. 3(*a*)). The fine silica particles are apt to self-assemble so that they may form a closest-packed multilayer (FIG. 3(*b*)). Actually, however, they are not closest-packed completely and hence form some "gaps" 6, which will be borders of the particles, namely, grain boundaries in the resultant electrode. Thereafter, the coated substrate is subjected to heat treatment, and thereby silica particles at the bottom of the multilayer are sunk into the organic polymer layer 3 (FIG. 3(*c*)). Successively, the coated substrate is cooled to room temperature, so that the silica particles only at the bottom are captured in the organic polymer layer 3. The coated substrate is then subjected to supersonic wave washing, to remove silica particles other than the particles captured in the polymer layer 3. Thus, the substrate before etching (FIG. 3(*d*)) is obtained.

The substrate is then subjected to an etching process utilizing $CF_4$ (FIG. 3(*e*)), and thereby the captured fine silica particles are made smaller to expand the gaps among the particles. The etching process utilizing $CF_4$ is thus carried out to reduce the size of silica particles so that the silica particles may have a size suitable for forming the openings in a desired size. Accordingly, the etching process is preferably conducted under such conditions that the organic polymer layer is hardly etched. After the silica particles are made to have an aimed size, the layer-provided substrate is subjected to $O_2$-RIE to form a dot pattern on the substrate (FIG. 3(*f*)). On the dot pattern, a metal is accumulated to form a metal electrode layer 7 (FIG. 3(*g*)). For example, a metal is vaporized and deposited to form the metal electrode layer. As described above, the metal as a material of the light-transmitting metal electrode is required to have a plasma frequency higher than the frequency of light to transmit. The metal is often contaminated with impurities such as oxygen, nitrogen and water. Even in that case, however, the metal can transmit light only if having a plasma frequency higher than the frequency of the light. After the metal is accumulated, the polymer is removed, for example, by supersonic wave washing as shown in FIG. 3(*h*). Thus, the light-transmitting metal electrode according to one embodiment of the present invention is obtained (FIG. 3(*i*)).

After the above steps of arranging the silica particles to form a monoparticle layer and making the particles smaller, the monoparticle layer of silica particles may be transferred to the organic polymer layer (resist layer) and then the etching process may be performed to form a pattern.

Further, it is also possible to produce a master plate as a stamper by the above steps before the metal is accumulated. The stamper thus-obtained can be used in a nano-in-printing process to transfer the pattern, on which a metal is then accumulated to produce a light-transmitting metal electrode. According to this method, it is possible to omit the etching process, which is relatively complicated, and hence to produce the electrode efficiently. The details are described in Examples described later.

Materials employable in the present invention are described below in detail.

The substrate used in the light-transmitting metal electrode is often made of materials having high transparency to light. Examples of the materials for the transparent substrate include amorphous quartz ($SiO_2$), Pyrex glass, fused silica, artificial fluorite, soda glass, potassium glass, and tungsten glass. However, in the case where the light-transmitting metal electrode is provided on a substrate of a solar battery or of a light-emitting element, the substrate is not restricted to be transparent. Examples of the materials for the substrate of a solar battery include single crystal silicon, polycrystal silicon, amorphous silicon, doped materials thereof, and chalcopyrite compound semiconductors. Examples of the materials for the substrate of a light-emitting element include AlGaAs, GaAsP, InGaN, GaP, ZnSe, AlGaInP, SiC, and sapphire ($Al_2O_3$). The organic polymer is used for a mask pattern when the metal electrode layer is deposited on the substrate. It is, therefore, preferred that the polymer can be easily removed by liquid remover, ultrasonic treatment, ashing, or oxygen plasma. That is to say, the polymer preferably consists of organic substances only. Examples of the preferred organic polymer include polyhydroxylstyrene, novolac resin, polyimide, cycloolefin polymer, and copolymers thereof.

In the present invention, metals constituting the electrode are desirably selected. Here, the term "metals" means materials which are conductors as simple substances, which exhibit metallic gloss, which have malleability, which are in the form of solid at room temperature and which consist of metal elements, or alloys thereof. In a practical embodiment, the material constituting the electrode preferably has a plasma frequency higher than the frequency $\omega$ of incident light. In addition, it is also preferred to have no absorption band in the wavelength region of light to use. Examples of the preferred materials satisfying those conditions include aluminum, silver, platinum, nickel, cobalt, gold, copper, rhodium, palladium, and chromium. Among those, aluminum, silver, platinum, nickel and cobalt are more preferred. However, the metal material is not restricted by those examples as long as it has a plasma frequency higher than the frequency of incident light. As described above, the present invention is advantageous in that it is unnecessary to use a rare metal such as indium and in that typical metals can be employed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

Example 1

First, a visible light-transmitting metal electrode was produced.

The present inventors have found the conditions for preparing a fine silica-monoparticle layer in which plural micro-domains having a period of 200 nm are formed. The pattern of the obtained monoparticle layer is transferred to a substrate in the manner described later. Thereafter, a metal electrode is formed by metal vapor-deposition onto the substrate having the transferred pattern, and then the metal deposited in the area of the transferred pattern is removed to produce a light-transmitting metal electrode. Concrete procedures are described below.

A thermosetting resist (THMR IP3250 [trademark], manufactured by Tokyo Ohka Kogyou Co., Ltd.) was diluted with ethyl lactate by 1:3. The solution was spin-coated at 1500 rpm for 30 seconds on a 4-inch amorphous quartz wafer (Photomask Substrate AQ [trademark], manufactured by Asahi Glass Co., Ltd.), and then heated on a hot-plate at 110° C. for 90 seconds, and further heated at 250° C. for 1 hour in an oxidation-free inert oven under nitrogen gas-atmosphere to perform a thermosetting reaction. The layer thus formed had a thickness of approx. 120 nm.

The thermosetting resist (THMR IP3250 [trademark], manufactured by Tokyo Ohka Kogyou Co., Ltd.) was again diluted with ethyl lactate by 1:5. The solution was further spin-coated at 3000 rpm for 30 seconds on the above resist-coated substrate, and then heated on a hot-plate at 110° C. for 90 seconds. The resist layer thus formed was subjected to etching for 5 seconds under the conditions of $O_2$: 30 sccm, 100 mTorr and a RF power of 100 W by means of a reactive etching system. As a result, the top resist layer was hydrophilized enough to have suitable wettabiliy for below-described coating of the dispersion solution.

A dispersion solution of fine silica particles (PL-13 [trademark], manufactured by Fuso Chemical Co., Ltd.) was filtered through a 1 μm mesh filter to prepare a coating solution. The solution was spin-coated at 1000 rpm for 60 seconds on the above resist-coated substrate. After drying, the substrate was annealed on a hot-plate at 220° C. for 30 minutes, so that fine silica particles only at the bottom were sunk into the above hydrophilized resist layer. Thereafter, the substrate was cooled to room temperature, and thereby the resist layer was hardened again to capture the silica particles only at the bottom.

The whole surface of the substrate was then rubbed with unwoven cloth (BEMCOT [trademark], manufactured by Ashahikasei Fibers Corporation) while being washed with pure water, to remove the silica particles other than those at the bottom.

The thus-obtained monoparticle layer of silica particles was subjected to etching for 225 seconds under the conditions of $CF_3$: 30 sccm, 10 mTorr and a RF power of 100 W, and thereby the fine silica particles were made smaller to expand the gaps among them. In this etching process, the underlying resist layer was not etched under the above conditions. The etching process was continued until the silica particles had a predetermined size. Thereafter, the remaining silica particles were used as a mask while the underlying thermosetting resist layer was subjected to etching of $O_2$-RIE for 105 seconds under the conditions of $O_2$: 30 sccm, 10 mTorr and a RF power of 100 W, and thereby the surface of the substrate in the etched area was completely bared. As a result, columnar structures of high aspect ratios were formed in the area where the etched silica particles were positioned, to obtain a pattern of columns.

Onto the pattern of columns thus-obtained, aluminum was deposited in a thickness of 30 nm by the resistance heat deposition method. The pattern of columns was then subjected to etching of $O_2$-RIE for 5 minutes under the conditions of $O_2$: sccm, 100 mTorr and a RF power of 100 W, and thereby only the resist layer in the area under the silica particles was etched. This treatment was carried out so that the resist layer in the area of the mask pattern might be easily removed. The pattern was then immersed in water and ultrasonically washed to remove, namely, to lift off the columnar structures. Thus, a light-transmitting metal electrode having desired openings was obtained.

Figure 4:
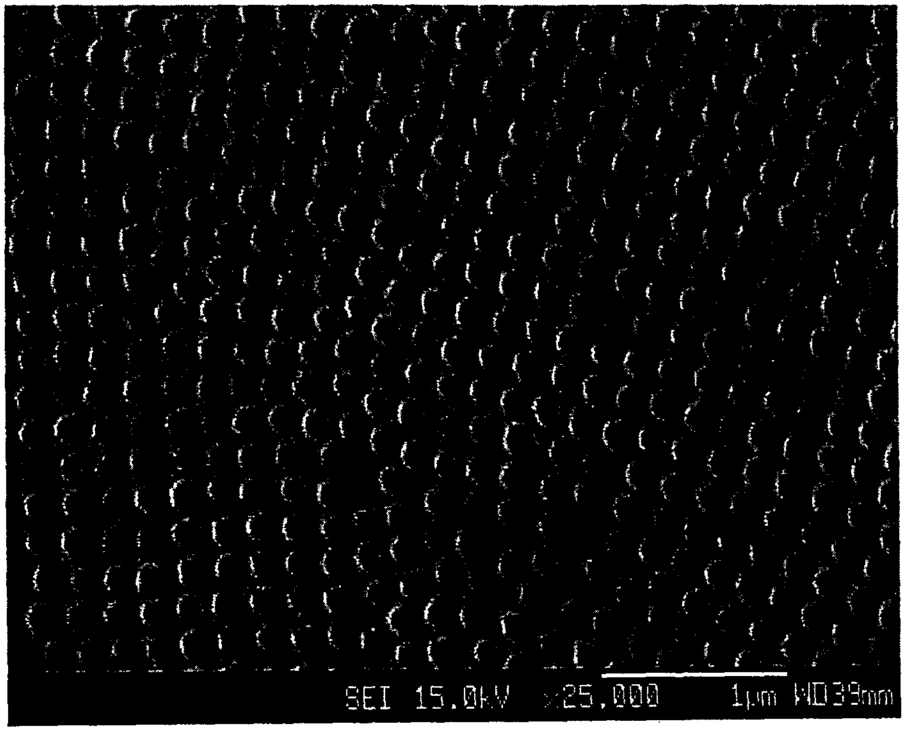
FIG. 4 is an electron micrograph showing an example of the pattern of the light-transmitting metal electrode having openings according to one embodiment of the present invention.

The light-transmitting metal electrode thus-obtained was observed with SEM, and the electron micrograph thereof was shown in FIG. 4.

Figure 5:
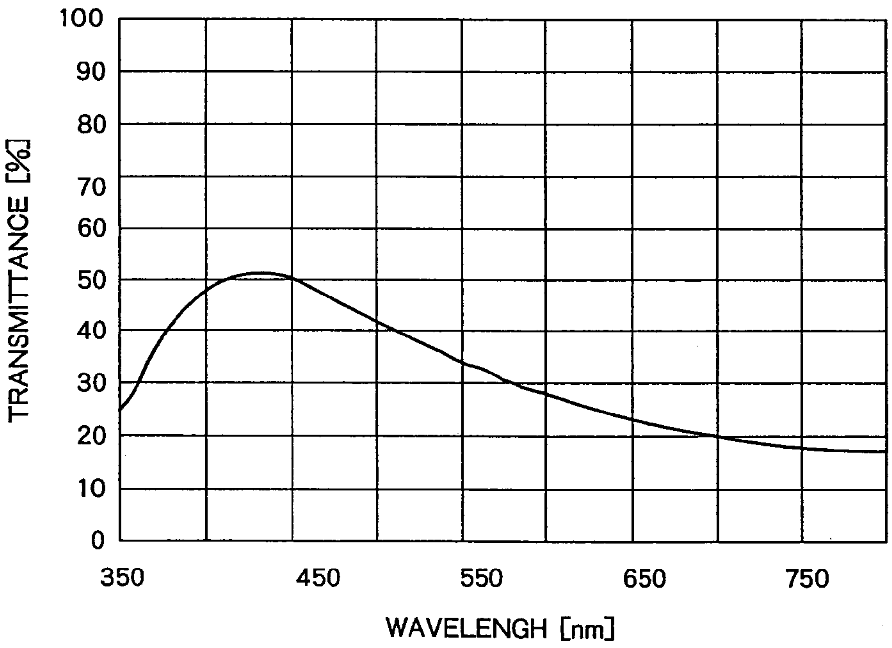
FIG. 5 is a visible region-transmitting spectrum of the light-transmitting metal electrode having openings according to one embodiment of the present invention.

The produced light-transmitting metal electrode had openings having an average diameter of approx. 100 nm, and the openings occupied approx. 30% of the whole area. The resistivity was approx. 17 μΩ·cm. Further, the transmission spectrum of the obtained electrode was measured by means of a spectrophotometer, and was shown in FIG. 5. The spectrum had a peak at approx. 420 nm, and the maximum transmittance was approx. 50%, which was much larger than the ratio of the area occupied by the openings in the electrode. In the cases where Al was replaced with Ag, Pt, Ni and Co, the maximum transmittances were much larger than the area ratios of the openings.

Example 2

Another visible light-transmitting metal electrode in which the area occupied by Al was reduced was produced. In this electrode, the ratio of the area occupied by the openings was increased to disturb the period and hence to weaken the wavelength dependence of transmitted light.

First, a thermosetting resist (THMR IP3250 [trademark], manufactured by Tokyo Ohka Kogyou Co., Ltd.) was diluted with ethyl lactate by 1:3. The solution was spin-coated at 1500 rpm for 30 seconds on a 4-inch amorphous quartz wafer (Photomask Substrate AQ [trademark], manufactured by Asahi Glass Co., Ltd.), and then heated on a hot-plate at 110° C. for 90 seconds, and further heated at 250° C. for 1 hour in an oxidation-free inert oven under nitrogen gas-atmosphere to perform a thermosetting reaction. The layer thus formed had a thickness of approx. 120 nm.

The thermosetting resist (THMR IP3250 [trademark], manufactured by Tokyo Ohka Kogyou Co., Ltd.) was again diluted with ethyl lactate by 1:5. The solution was further spin-coated at 3000 rpm for 30 seconds on the above resist-coated substrate, and then heated on a hot-plate at 110° C. for 90 seconds. The resist layer thus formed was subjected to etching for 5 seconds under the conditions of $O_2$: 30 sccm, 100 mTorr and a RF power of 100 W by means of a reactive etching system.

A dispersion solution of fine silica particles (PL-13 [trademark], manufactured by Fuso Chemical Co., Ltd.) was filtered through a 1 μm mesh filter to prepare a coating solution. The solution was spin-coated at 1000 rpm for 60 seconds on the above resist-coated substrate. After drying, the substrate was annealed on a hot-plate at 220° C. for 30 minutes. The whole surface of the substrate was then rubbed with unwoven cloth (BEMCOT [trademark], manufactured by Ashahikasei Fibers Corporation) while being washed with pure water, to remove the silica particles other than those at the bottom.

The thus-obtained monoparticle layer of silica particles was subjected to etching for 210 seconds under the conditions of $CF_3$: 30 sccm, 10 mTorr and a RF power of 100 W. Thereafter, the remaining silica particles were used as a mask while the underlying thermosetting resist layer was subjected to etching of $O_2$-RIE for 105 seconds under the conditions of $O_2$: 30 sccm, 10 mTorr and a RF power of 100 W, and thereby the surface of the substrate in the etched area was completely bared. As a result, columnar structures of high aspect ratios were formed in the area where the etched silica particles had been positioned, to obtain a pattern of columns.

Figure 6:
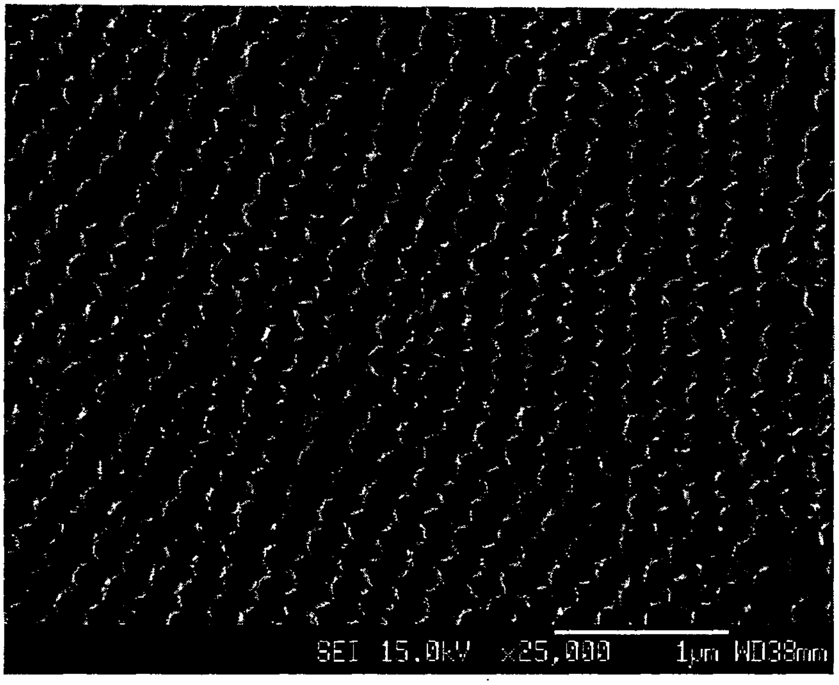
FIG. 6 is an electron micrograph showing an example of the pattern of the light-transmitting metal electrode having openings according to another embodiment of the present invention.

Onto the pattern of columns thus-obtained, aluminum was deposited in a thickness of 30 nm by the resistance heat deposition method. The pattern of columns was then subjected to etching of $O_2$-RIE for 5 minutes under the conditions of $O_2$: 30 sccm, 100 mTorr and a RF power of 100 W. The pattern was then immersed in water and ultrasonically washed to remove, namely, to lift off the columnar structures. Thus, a light-transmitting metal electrode having desired openings was obtained. The light-transmitting metal electrode thus-obtained was observed with SEM, and the electron micrograph thereof was shown in FIG. 6.

Figure 7:
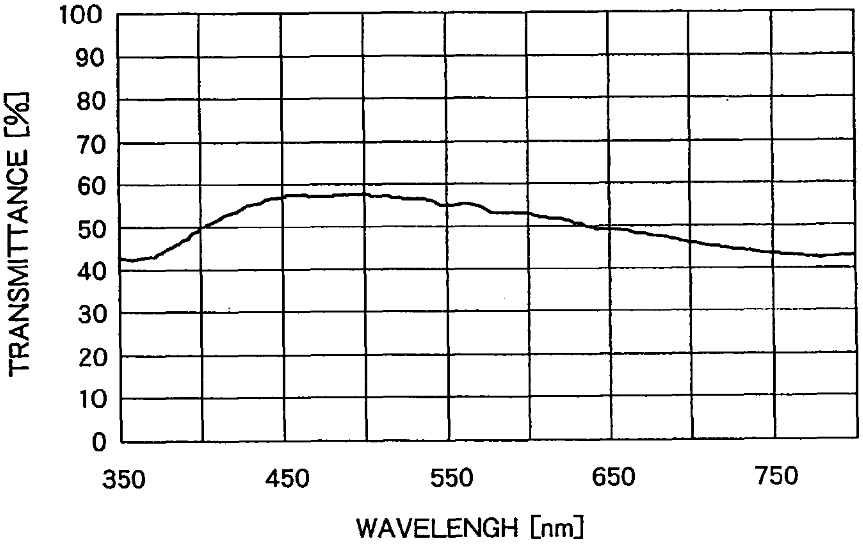
FIG. 7 is a visible region-transmitting spectrum of the light-transmitting metal electrode having openings according to another embodiment of the present invention.

The produced light-transmitting metal electrode had openings having an average diameter of approx. 130 nm, and the openings occupied approx. 38% of the whole area. It was confirmed by the electron micrograph that the area occupied by the metal was smaller than that in Example 1. The resistivity was approx. 110 μΩ·cm, which was larger than that in Example 1. The transmission spectrum of the obtained electrode was measured by means of a spectrophotometer, and was shown in FIG. 7. The spectrum had a broad plateau in the visible region, and the transmittance was approx. 55% to 60%, which was much larger than the ratio of the area occupied by the openings in the electrode.

Example 3

This example describes a mass-production method utilizing nano-in-print technology. For the purpose of easy understanding, the method is explained with FIG. 8 referred to. However, in practical applications, minor conditions may be changed from those described below. In this method, the columnar pattern of fine silica particles is used as a mold to produce a Ni-made stamper for nano-in-print.

First, a thermosetting resist (THMR IP3250 [trademark], manufactured by Tokyo Ohka Kogyou Co., Ltd.) was diluted with ethyl lactate by 1:3. The solution was spin-coated at 1500 rpm for 30 seconds on a 6-inch silicon wafer 11, and then heated on a hot-plate at 110° C. for 90 seconds, and further heated at 250° C. for 1 hour in an oxidation-free inert oven under nitrogen gas-atmosphere to perform a thermosetting reaction. The layer 12 thus formed had a thickness of approx. 120 nm.

The thermosetting resist (THMR IP3250 [trademark], manufactured by Tokyo Ohka Kogyou Co., Ltd.) was again diluted with ethyl lactate by 1:5. The solution was further spin-coated at 3000 rpm for 30 seconds on the above resist-coated substrate, and then heated on a hot-plate at 110° C. for 90 seconds. The resist layer thus formed was subjected to etching for 5 seconds under the conditions of $O_2$: 30 sccm, 100 mTorr and a RF power of 100 W by means of a reactive etching system. As a result, the top resist layer 13 was hydrophilized enough to have suitable wettabiliy for below-described coating of the dispersion solution.

A dispersion solution of fine silica particles (PL-13 [trademark], manufactured by Fuso Chemical Co., Ltd.) was filtered through a 1 μm mesh filter to prepare a coating solution. The solution was spin-coated at 1000 rpm for 60 seconds on the above resist-coated substrate. After drying, the substrate was annealed on a hot-plate at 220° C. for 30 minutes, so that fine silica particles 14 only at the bottom were sunk into the above hydrophilized resist layer 13. Thereafter, the substrate was cooled to room temperature, and thereby the resist layer was hardened again to capture the silica particles only at the bottom.

The whole surface of the substrate was then rubbed with unwoven cloth (BEMCOT [trademark], manufactured by Ashahikasei Fibers Corporation) while being washed with pure water, to remove the silica particles other than those at the bottom. As a result, a monoparticle layer of silica particles was formed on the resist layer 12 (FIG. 8(*a*)).

Figure 8:
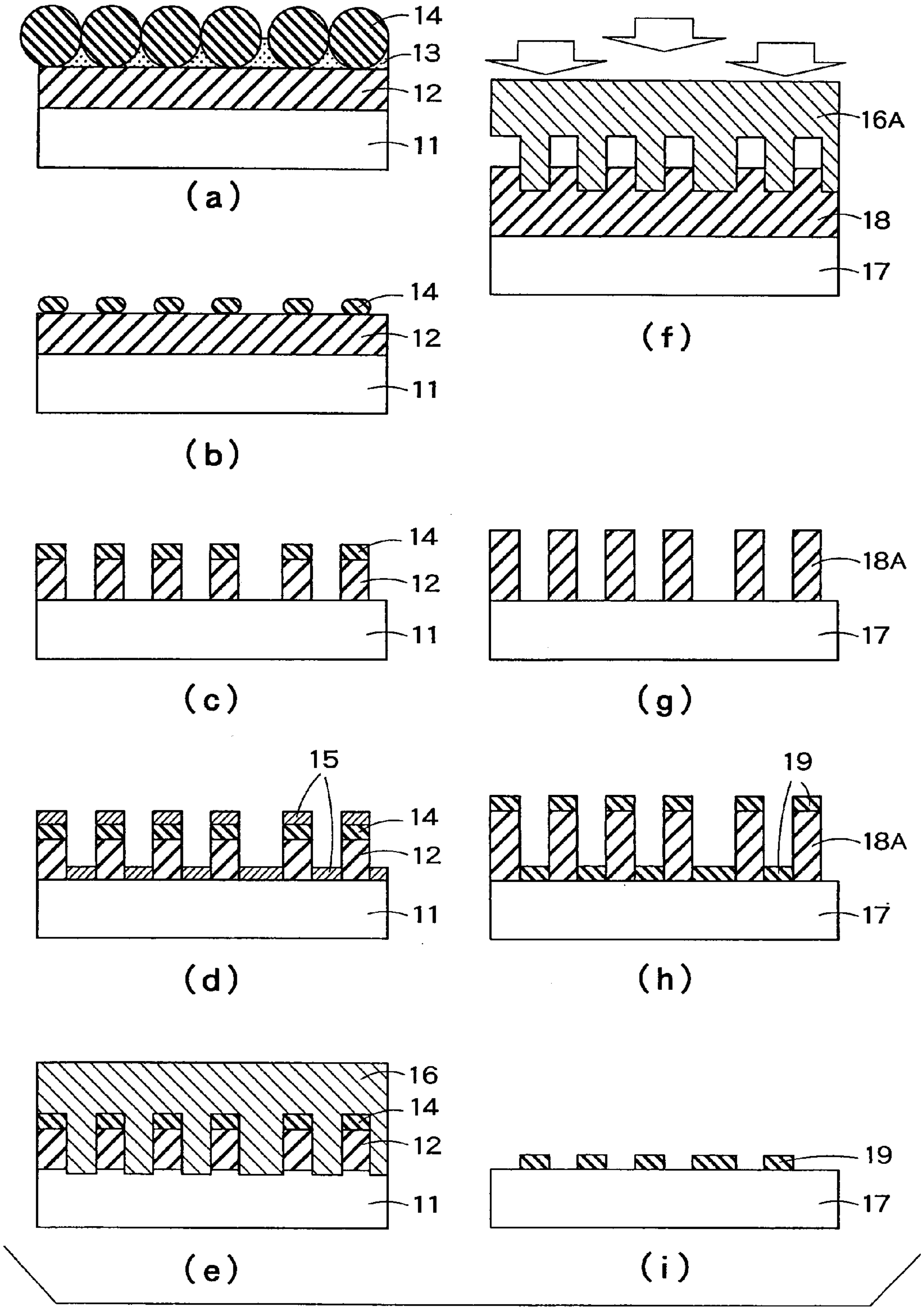
FIG. 8 schematically illustrates an example of the process for production of the light-transmitting metal electrode having openings according to another embodiment of the present invention.

The thus-obtained monoparticle layer of silica particles was subjected to etching for 225 seconds under the conditions of $CF_3$: 30 sccm, 10 mTorr and a RF power of 100 W, and thereby the fine silica particles were made smaller to expand the gaps among them (FIG. 8(*b*)). In this etching process, the underlying resist layer was not etched under the above conditions. The etching process was continued until the silica particles had a predetermined size. Thereafter, the remaining silica particles were used as a mask while the underlying thermosetting resist layer was subjected to etching of $O_2$-RIE for 105 seconds under the conditions of $O_2$: 30 sccm, 10 mTorr and, a RF power of 100 W, and thereby the surface of the substrate in the etched area was completely bared. As a result, columnar structures of high aspect ratios were formed in the area where the etched silica particles were positioned, to obtain a pattern of columns (FIG. 8(*c*)).

Onto the pattern of columns consisting of the etched silica particles and the resist on the silicon wafer, an electrically conductive layer 15 was formed by a sputtering process (FIG. 8(*d*)). Prior to the sputtering procedure, the sputtering chamber was evacuated to $8\times10^{-3}$ Pa and then filled with Ar at 1 Pa. The sputtering was carried out for 40 seconds at a DC power of 400 W. As a target of the sputtering, pure nickel was used. The electrically conductive layer thus-obtained had a thickness of 30 nm.

Thereafter, a plated layer 16 was formed by plating for 90 minutes in a nickel (II) sulfamate plating solution (NS-160 [trademark], manufactured by Showa Chemical Industry CO., LTD.), to obtain a master plate for resist processing. The plating conditions are as follows:

Nickel sulfamate: 600 g/L,
Boric acid: 40 g/L,
Surface active agent (sodium lauryl sulfate): 0.15 g/L,
Temperature of solution: 55° C.,
pH: 4.0, and
Current density: 20 A/dm$^2$.

The plated layer 16 had a thickness of 0.3 mm. The plated layer 16 was then peeled off from the wafer on which the etched silica and the resist columns were provided, to obtain a self-supported layer made of plated nickel.

The residual resist and silica attached on the layer 16 can be removed generally by $CF_4$ etching or by oxygen plasma ashing. Accordingly, the surface of the layer 16 obtained above was subjected to oxygen plasma ashing and $CF_4/O_2$ RIE to remove the residue, and further subjected to a punching process to remove burrs. Thus, a stamper for nano-in-print 16A was obtained. Since obtained from a mold of the columnar pattern, the obtained stamper had a hole-pattern comprising innumerable openings. The stamper 16A, onto which the arrangement pattern of fine silica particles was transferred, was used as a master plate of nano-in-print described below.

The thermosetting resist (THMR IP3250 [trademark], manufactured by Tokyo Ohka Kogyou Co., Ltd.) was diluted with ethyl lactate by 1:3. The solution was spin-coated at 2500 rpm for 30 seconds on a 2-inch square quartz substrate 17, and then heated on a hot-plate at 110° C. for 90 seconds to form a resist layer 18 having a thickness of 120 nm. The coated substrate was then placed on a stage of nano-in-print apparatus, and pressed for 1 minute at room temperature under 200 Mpa with the stamper for nano-in-print 16A to in-print the hole-pattern (FIG. 8(*f*)). Thus, the columnar pattern of resist 18A was formed on the quartz substrate (FIG. 8(*g*)). The resist layer on which the pattern had been thus transferred was then subjected to RIE with $CF_4$+$H_2$ gas, so that the residual resist left by the in-print was removed. As a result, the surface of the substrate 17 in the area where the columnar pattern was not positioned was completely bared.

Onto the columnar pattern of resist on the quartz substrate, aluminum was deposited in a thickness of 30 nm by the resistance heat deposition method to form an aluminum layer 19 (FIG. 8(*h*)). The layer was then subjected to etching of $O_2$-RIE for 5 minutes under the conditions of $O_2$: 30 sccm, 100 mTorr and a RF power of 100 W. The sample was then immersed in water and ultrasonically washed to remove, namely, to lift off the columnar pattern. Thus, a light-transmitting metal electrode having desired openings was obtained (FIG. 8(*i*)).

The maximum transmittance of the obtained electrode in the visible region was approx. 50%, and the resistivity was approx. 19 μΩ·cm. This meant that the electrode had almost the same performance as that of Example 1. Even after the in-print process, the Ni-made stamper produced in this example was not damaged in the pattern shape and accordingly it was possible to use the sampler for producing the pattern repeatedly.

The invention claimed is:

1. A process for production of a light-transmitting metal electrode, comprising:
- preparing a substrate; and
- carrying out an etching process using a monoparticle layer of fine particles arranged in the form of a dot pattern of microdomains as a mask, to produce a metal electrode layer, on the substrate, having a thickness of 10 to 200 nm and including
  - a continuous metal part, any two points in the continuous metal part being continuously connected without breaks, and
  - a plurality of openings penetrating through the metal electrode layer and being arranged so that a distribution of the openings is represented by a radial distribution function curve having a half-width of 5 to 300 nm.

2. A process for production of a light-transmitting metal electrode, comprising:
- preparing a substrate;
- forming an organic polymer layer on the substrate;
- forming a monoparticle layer of fine particles in the form of a dot pattern of microdomains on the organic polymer layer;
- processing the fine particles by etching until the fine particles have a desired size;
- etching the organic polymer layer, so that columnar structures made of organic polymer and the etching-processed fine particles are formed on the substrate;
- forming a metal electrode layer, among the formed columnar structures, to have a thickness of 10 to 200 nm and include
  - a continuous metal part, any two points in the continuous metal part being continuously connected without breaks, and
  - a plurality of openings penetrating through the metal electrode layer and being arranged so that a distribution of the openings is represented by a radial distribution function curve having a half-width of 5 to 300 nm; and
- removing the organic polymer layer.

3. A process for production of a light transmitting metal electrode comprising:

preparing a substrate;

forming an organic polymer layer on the substrate;

forming a monoparticle layer of fine particles in the form of a dot pattern of microdomains on the organic polymer layer;

processing the fine particles by etching until the fine particles have a desired size;

etching the organic polymer layer, so that columnar structures made of organic polymer and the etching-processed fine particles are formed on the substrate;

forming a metal electrode layer, among the formed columnar structures, to have a thickness of 10 to 200 nm and include a plurality of microdomains neighboring each other, wherein:

each of the microdomains includes a continuous metal part, any two points in the continuous metal part being continuously connected without breaks, and a plurality of openings penetrating through the metal electrode layer and being arranged periodically along an arranging direction, the arranging directions of two neighboring microdomains are different from each other, and a distribution of the openings in the metal electrode layer is represented by a radial distribution function curve having a half-width of 5 to 300 nm; and removing the organic polymer layer.

4. A process for production of a light-transmitting metal electrode, comprising:

preparing a substrate, performing an etching process by using a monoparticle layer of fine particles arranged in the form of a dot pattern of microdomains as a mask, to form a structure having the dot pattern on the substrate, using the dot-patterned structure formed on the substrate as a mold, to produce a stamper having said structure on a second substrate, putting said stamper onto a third substrate so as to transfer the pattern, so that a structure having the transferred pattern is formed; and then using the structure formed by transferring as a mask to produce a metal electrode layer having openings.

5. A process for production of a light-transmitting metal electrode including a plurality of microdomains neighboring each other, comprising:

preparing a substrate, performing an etching process by using a monoparticle layer of fine particles arranged in the form of a dot pattern of microdomains as a mask, to form a structure having the dot pattern, using the dot-patterned structure formed on the substrate as a mold, to produce a stamper having said structure on a second substrate, putting said stamper onto a third substrate so as to transfer the pattern, so that a structure having the transferred pattern is formed; and then using the structure formed by transferring as a mask to produce a metal electrode layer having openings.

* * * * *